United States Patent [19]

Sharpe-Geisler

[11] Patent Number: 5,739,713

[45] Date of Patent: Apr. 14, 1998

[54] DECONVOLUTION INPUT BUFFER COMPENSATING FOR CAPACITANCE OF A SWITCH MATRIX OF A HIGH DENSITY PROGRAMMABLE LOGIC DEVICE

[75] Inventor: Bradley A. Sharpe-Geisler, San Jose, Calif.

[73] Assignee: Advanced Micro Devices, Inc., Sunnyvale, Calif.

[21] Appl. No.: 574,776

[22] Filed: Dec. 19, 1995

[51] Int. Cl.$^6$ .......................... H03K 17/16; H03K 19/00
[52] U.S. Cl. .......................... 327/379; 327/382; 327/389; 327/391; 327/108; 326/27
[58] Field of Search .......................... 327/205, 206, 327/263, 264, 285, 379–382, 387–389, 391–393, 170, 173, 174, 108; 326/21, 1, 27, 29, 31, 34

[56] References Cited

U.S. PATENT DOCUMENTS

| | | | |
|---|---|---|---|
| 4,355,284 | 10/1982 | Acker | 328/155 |
| 4,539,489 | 9/1985 | Vaughn | 307/290 |
| 4,571,504 | 2/1986 | Iwamoto | 327/206 |
| 5,012,141 | 4/1991 | Tomisawa | 307/594 |
| 5,321,326 | 6/1994 | Shigehara et al. | 326/21 |
| 5,347,177 | 9/1994 | Lipp | 307/443 |
| 5,396,109 | 3/1995 | Oshiba | 327/233 |
| 5,495,195 | 2/1996 | Fontana et al. | 327/379 |

FOREIGN PATENT DOCUMENTS

| | | | |
|---|---|---|---|
| 57-673319 | 4/1982 | Japan | 327/206 |
| 58-184815 | 10/1983 | Japan | 327/206 |
| 59-58910 | 4/1984 | Japan | 327/205 |
| 59-193614 | 11/1984 | Japan | 327/206 |
| 1-231515 | 9/1989 | Japan | 327/206 |
| 3-64115 | 3/1991 | Japan | 327/206 |
| 5-183396 | 7/1993 | Japan | 327/206 |
| WO 95/26590 | 10/1995 | WIPO | H03K 19/094 |
| WO 96/16477 | 5/1996 | WIPO | H03K 19/003 |

OTHER PUBLICATIONS

IBM Technical Disclosure Bulletin, *Process Tracking Delay Element*, vol. 36, No. 09A, Sep. 1993.

Primary Examiner—Timothy P. Callahan
Assistant Examiner—T. T. Lam
Attorney, Agent, or Firm—Fliesler, Dubb, Meyer & Lovejoy

[57] ABSTRACT

A buffer which provides compensation for the RC time delay introduced by a switch matrix of a high density programmable logic device (PLD). The buffer includes circuitry to provide an input threshold which varies to compensate for the RC delay of the switch matrix on a high to low input signal transition. The buffer further includes a negative hysteresis circuit to prevent oscillations on slow rate low to high input signal transitions.

14 Claims, 6 Drawing Sheets

DECONVOLUTION INPUT BUFFER COMPENSATING FOR CAPACITANCE OF A SWITCH MATRIX OF A HIGH DENSITY PROGRAMMABLE LOGIC DEVICE

BACKGROUND OF THE INVENTION

1. Field of the Invention

The present invention relates to input buffers for integrated circuit devices. More particularly, the present invention relates to input buffers capable of compensating for the RC time delay introduced by a switch matrix of a high density programmable logic device (PLD).

2. Description of the Related Art

Figure 1:
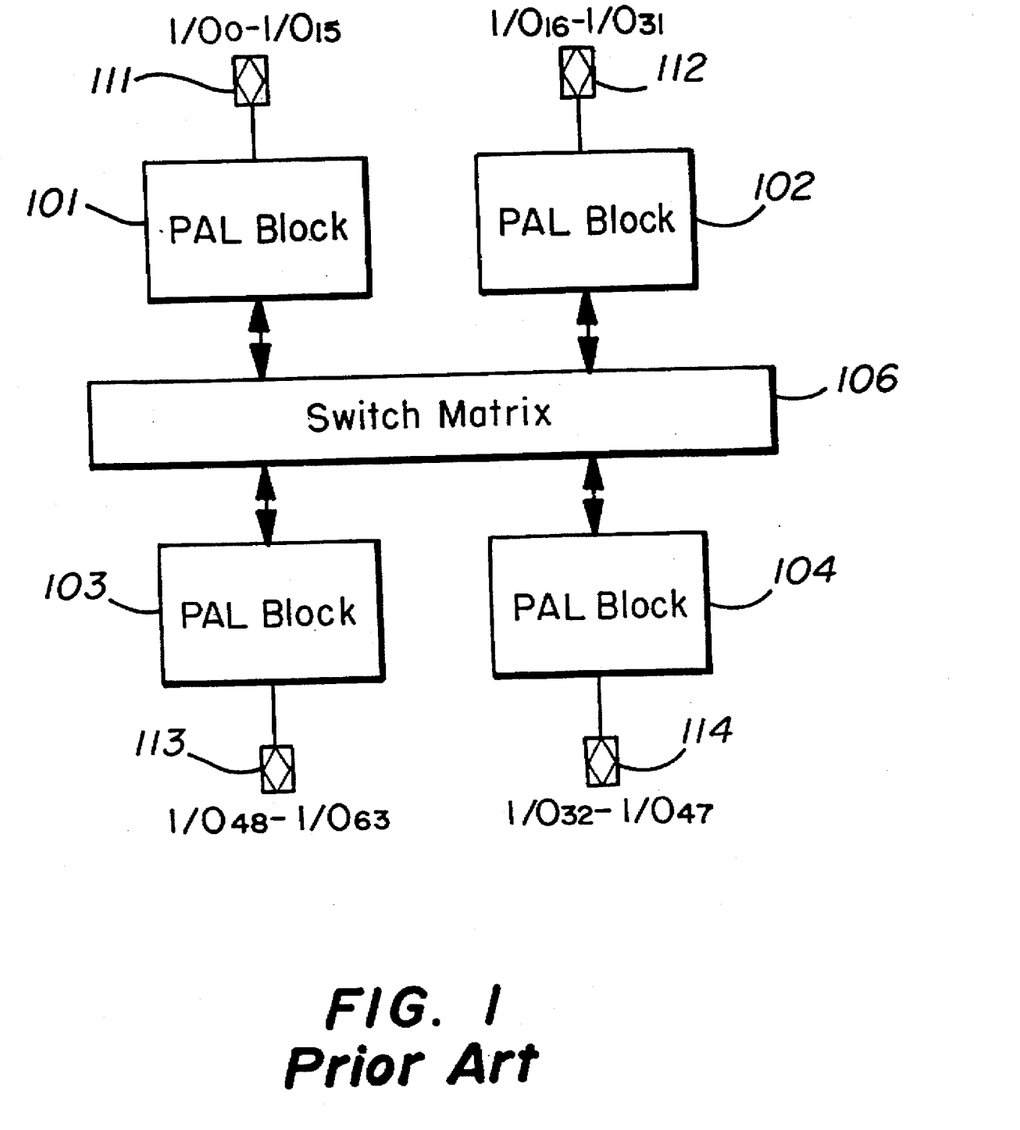
FIG. 1 shows a block diagram for a typical high density programmable logic device (PLD)

FIG. 1 shows a block diagram for a typical high density PLD. As shown, the high density PLD includes four programmable array logic (PAL) blocks 101–104 interconnected by a programmable switch matrix 106. The PAL blocks 101–104 can be viewed as independent PLD devices on the chip, each similar to the popular lower density 22V10 PAL device, available from Advanced Micro Devices, Inc. The switch matrix 106 connects the PAL blocks to each other and to all I/O pins 111–114 enabling the high density PLD device, including four PAL blocks, to provide six times the logic capability of the 22V10.

Figure 2:
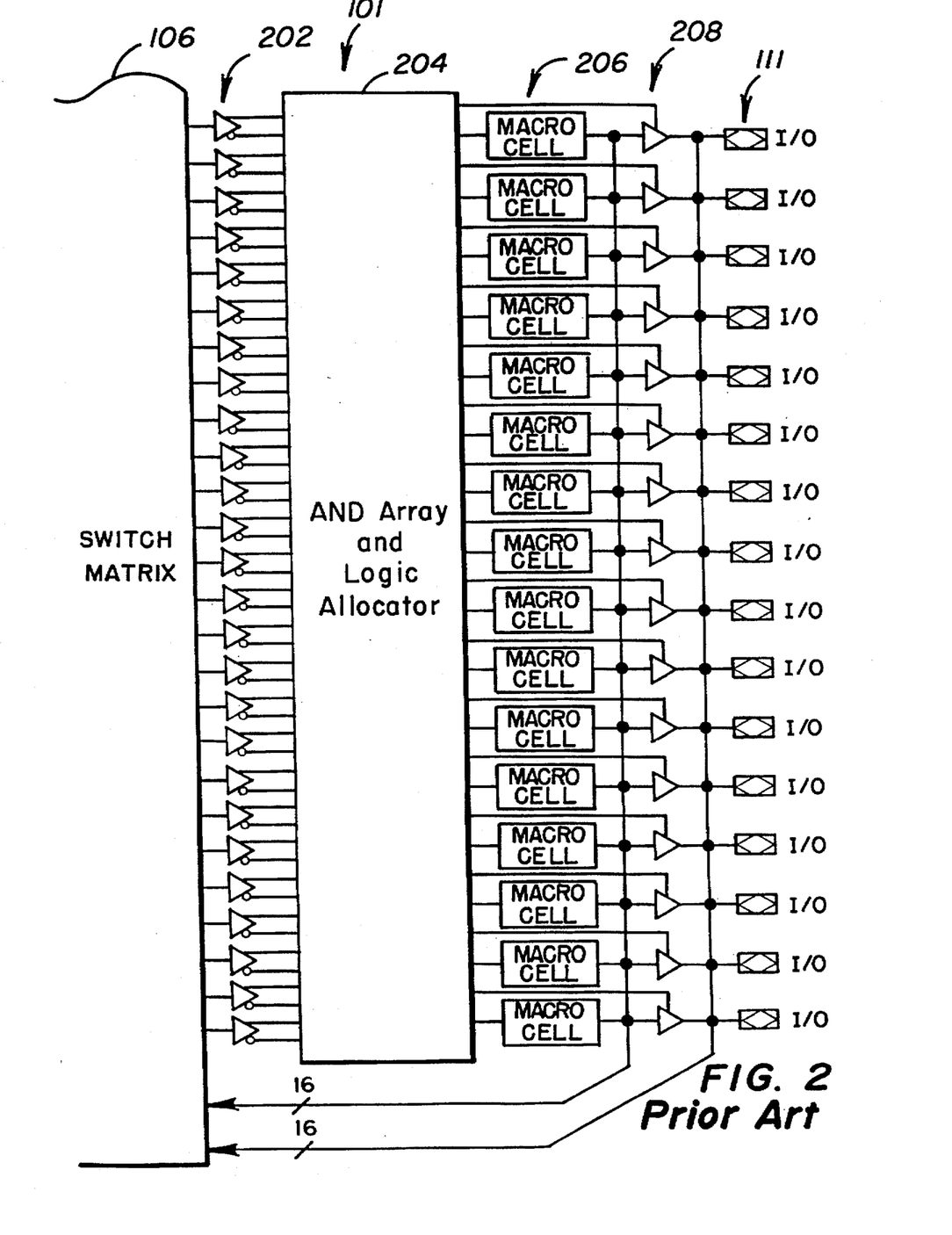
FIG. 2 greater detail for one quarter of the PLD shown in FIG. 1.

FIG. 2 shows greater detail for one quarter of the PLD block diagram of FIG. 1, including PAL block 101 as connected to switch matrix 106. Note that circuit components, such as switch matrix 106 carried forward from FIG. 1 are similarly labeled in FIG. 2, as will be circuit components carried forward in subsequent figures. PAL block 101 receives inputs, such as the 26 inputs shown, from the switch matrix 106 to input buffers 202. Input buffers 202 buffer the signals to AND array and logic allocator circuitry 204 which provides programmable AND and OR logic between the input buffers 202 and output logic macrocells 206.

The output logic macrocells 206 are programmable to provide registered or combinatorial outputs. The outputs of the macrocells 206 are provided to tri-state output buffers 208 and are also provided on feedback lines to the switch matrix 106.

Each tri-state output buffer 208 can be enabled for use as an output buffer, or disabled so that I/O ports 111 can provide input signals to the PLD. Enabling or disabling signals for the tri-state buffers are provided by the AND array and logic allocator circuit 204. When the tri-state output buffers 208 are enabled, outputs are provided from the output buffers 208 through I/O ports 111 as well as through feedback lines to the switch matrix 106. When the output buffers 208 are disabled, input signals from external circuitry are provided through I/O ports 111 to the switch matrix 106. The switch matrix 106 includes circuitry to distribute the signals received from the tri-state output buffers 208 and I/O ports 111 back to the PAL blocks 101–104.

Figure 3:
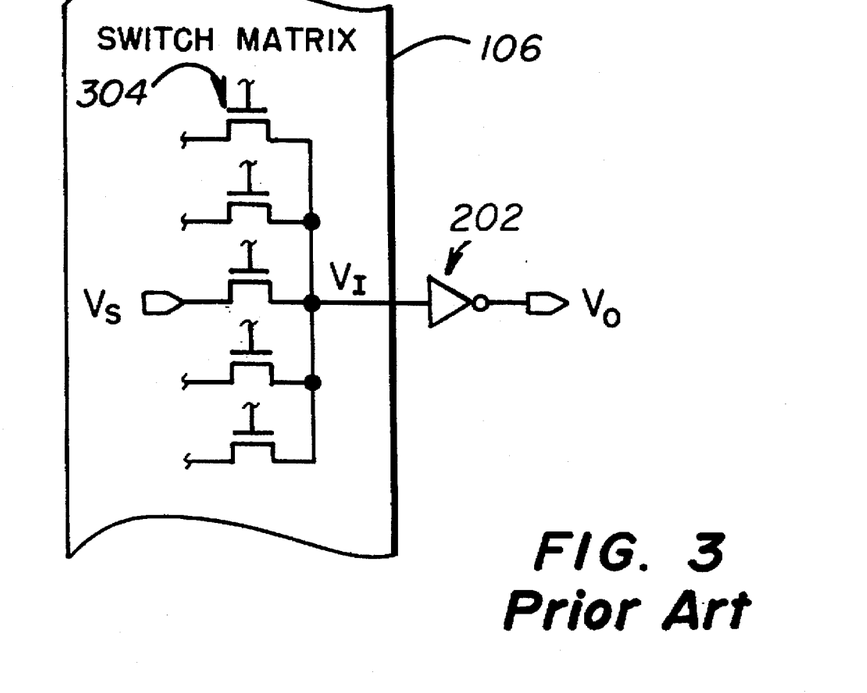
FIG. 3 shows a cut away view of a portion of the switch matrix of FIG. 2 as connected to the input of an input buffer.

FIG. 3 shows a cut away view of a portion of the switch matrix 106 as connected to the input of one of the input buffers 202. As shown the switch matrix 106 includes a plurality of pass gates 304 all feeding the input of the one input buffer. In the switch matrix one pass gate will be enabled to supply a signal such as $V_S$ to the input of the input buffer as a signal $V_I$.

Figure 4:
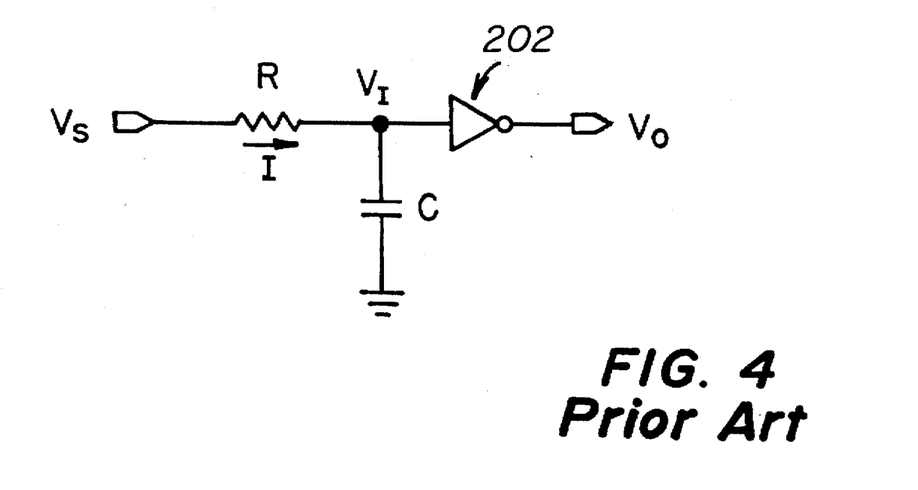
FIG. 4 shows an equivalent circuit for the circuitry shown in FIG. 3.

As shown by the equivalent circuit for the circuitry of FIG. 3 in FIG. 4, the plurality of pass gates 304 supplying one of input buffers 202 creates a capacitance C while line resistance creates a resistance R at the input of the input buffer. Thus, an RC delay is added between the signal $V_S$ and the signal $V_I$. Because the RC delay distorts the signal $V_S$ originally received, it is desirable to compensate for any RC delay of the switch matrix in the input buffer to provide an output signal $V_O$ representative of the signal $V_S$ originally input to the switch matrix.

SUMMARY OF THE INVENTION

The present invention provides an input buffer capable of providing compensation for the RC delay of a switch matrix to enable the input buffer to more accurately reproduce a signal originally input to the switch matrix.

The buffer of the present invention includes circuitry to provide an input threshold which varies to compensate for the RC delay of the switch matrix on a high to low input signal transition. The buffer of the present invention provides an increasing threshold as the negative rate of change of a voltage signal input to the buffer ($-dV_I/dt$) increases with respect to time. To create the variable threshold, the buffer of the present invention includes:

- an inverter having an input forming the buffer input and an output coupled to the buffer output;
- an PMOS pull up transistor having a gate connected to the input of the inverter, and a source connected to $V_{DD}$;
- an NMOS pull up switching transistor which is a depletion device having a drain connected to the drain of the PMOS pull up transistor and a source connected to the output of the inverter; and
- an NMOS pass transistor having a source to drain path connecting the input of the inverter to the gate of the NMOS pull up switching transistor; and Because the buffer only has a varying threshold on a high to low transition of an input signal, the buffer further includes a negative hysteresis circuit to prevent oscillations on slow rate low to high input signal transitions. The negative hysteresis circuit includes:

- an NMOS hysteresis pull down transistor having a drain connected to the buffer output, and a source connected to $V_{SS}$;
- an NMOS hysteresis switching pull down transistor having a drain connected to the gate of the NMOS hysteresis pull down transistor, and a source connected to $V_{SS}$;
- a hysteresis pass gate coupling the buffer input to the gate of the NMOS hysteresis pull down transistor;
- a first hysteresis inverter having an input connected to the buffer input; and
- a second hysteresis inverter having an input connected to the output of the first hysteresis inverter and the gate of the hysteresis pass gate, and an output connected to the gate of the NMOS hysteresis switching pull down transistor; and
- a hysteresis control transistor having a source to drain path coupling the input of the second hysteresis inverter to $V_{DD}$, and a gate connected to the output of the second hysteresis inverter.

BRIEF DESCRIPTION OF THE DRAWINGS

Further details of the present invention are explained with the help of the attached drawings in which.

DETAILED DESCRIPTION

The present invention provides an input buffer producing an output signal $V_O$ matching a high to low $V_S$ signal transition originally received by a switch matrix as determined from a signal $V_I$ received at the input of the buffer from an output of the switch matrix. The input buffer of the present invention matches only the high to low $V_S$ signal transition to simplify circuitry, because a significant operation speed improvement is obtained by matching the high to low $V_S$ signal transition.

To understand how $V_O$ can be determined from $V_S$ when only $V_I$ is received at the input of the input buffer, it is first helpful to mathematically determine the signal $V_S$ in terms of $V_I$. From the equivalent circuit of FIG. 4, $V_S$ can be determined in terms of $V_I$ using the following equations:

$$I=(V_S-V_I)/R \quad (1)$$

$$I=C(dV_I/dt) \quad (2)$$

Solving equations (1) and (2) for $V_S$ in terms of $V_I$ we get the following equation:

$$V_S=V_I+RC(dV_I/dt) \quad (3)$$

Figure 5:
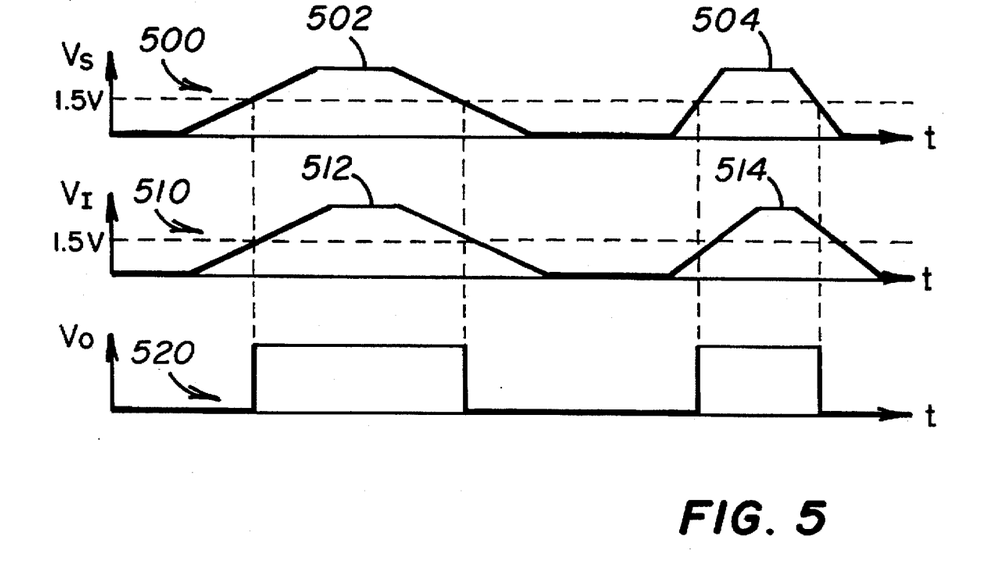
FIG. 5 shows a timing diagram for voltages $V_S$, $V_I$, and $V_O$ of FIG. 4 when a specific $V_S$ signal is received.

Further to understand how $V_S$ can be determined from $V_I$, FIG. 5 provides a timing diagram for voltages $V_S$, $V_I$, and $V_O$ of FIG. 4 when a specific $V_S$ signal 500 is received. In FIG. 5, the $V_S$ signal 500 includes two pulses, a first pulse 502 which switches slowly and has a shallow slope and a second pulse 504 which switches rapidly and has a steep slope. As seen by the resulting $V_I$ signal 510 in FIG. 5, if the signal $V_S$ switches slowly with a shallow slope as in pulse 502, $dV_I/dt$ will have a small value so that little or no RC delay component will exist in equation (3) making $V_I$ approximately equal to $V_S$ as shown in pulse 512. However, when $V_S$ switches rapidly with a steep slope as in pulse 504, $dV_I/dt$ will have a large value so that the RC delay component in equation (3) will be significant as shown by pulse 514.

The output of an input buffer typically transitions when an input pulse transitions through a specific voltage, for example 1.5 V. To compensate for any RC delay component of the switch matrix, it is desirable to transition $V_O$ when $V_S$, rather than $V_I$, transitions through 1.5 V. Such a desired $V_O$ signal 520 is shown in FIG. 5, and as shown by the dashed lines, transitions when the $V_S$ signal 500 transitions through 1.5 V.

For the input buffer to provide the $V_O$ signal 520 at its output, it is desirable for the input buffer to have a variable input threshold. For a high to low transition of the $V_S$ pulse 512 or 514, the threshold should be higher than the 1.5 V point on the pulse as shown by where the dashed lines cross pulses 512 and 514. Further as indicated by where the dashed lines cross $V_I$ pulses 512 and 514 and as can be shown from equation (3), as the $V_S$ pulse slope gets steeper the threshold voltage should be moved farther from the 1.5 V point on the $V_I$ pulse.

Figure 6:
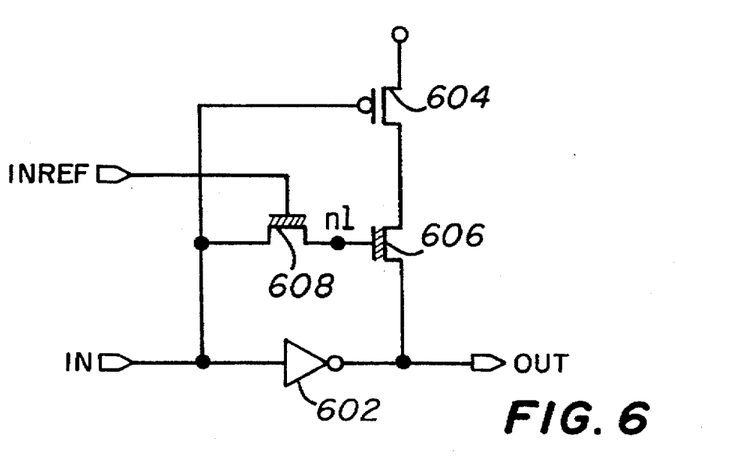
FIG. 6 shows an embodiment of an input buffer of the present invention.

FIG. 6 shows circuitry for an embodiment of an input buffer of the present invention which utilizes a variable input threshold to produce a $V_O$ signal similar to 520 of FIG. 5 from a $V_I$ signal such as 510 from a switch matrix on a high to low signal transition. The input buffer of FIG. 6 includes a first inverter 602 with an input forming the input (IN) of the buffer and an output coupled to the output (OUT) of the buffer. The input buffer further includes a PMOS pull up transistor 604 with a gate connected to the input of inverter 602 and a source connected to $V_{DD}$. An NMOS switching transistor 606 has a drain connected to the drain of transistor 604 and a source connected to the output of inverter 602. The hatched lines on the gate of transistor 606 indicate that additional ion implantation is added to its channel to provide a depletion mode transistor with a negative threshold. A depletion mode transistor for 606 prevents an NMOS threshold voltage drop from its source to drain. Further, note that in FIG. 6, as well as in subsequent drawings, that a PMOS transistor, such as 604, is represented with a circle on its gate, while an NMOS transistor, such as 606, has no gate circle.

Additionally included in the input buffer of FIG. 6 is a cascode pass gate transistor 608. Cascode transistor 608 has a source connected to the input of inverter 602 and a drain connected at a node n1 to the gate of transistor 606. The gate of cascode transistor 608 is connected to a reference voltage INREF. INREF is preferably set to $V_{DD}$. The hatched lines on the gate of transistor 608 indicate that additional ion implantation is added to its channel to create a depletion mode transistor, similar to transistor 606.

Note that a cascode transistor is a transistor defined by being turned on and off by varying voltage applied to the source with the gate voltage fixed, rather than varying the gate voltage. In a cascode transistor with $(v_g-v_s)>v_t$, wherein $v_g$ is the gate voltage, $v_s$ is the source voltage, and $v_t$ is the threshold voltage of the transistor, the cascode transistor will turn on. With $(v_g-v_s)<v_t$, the cascode transistor will turn off.

The inverter 602 provides a nominal threshold, such as at 1.5 volts. To vary the input threshold from a threshold of the inverter 602 to provide a greater threshold during a high to low transition, transistor 604 is provided. With inverter 602 acting without transistors 604, its threshold is determined by a ratio of its PMOS pull up transistor channel width to its NMOS pull down transistor channel width. If transistor 604 is combined with the pull up transistor of inverter 602, the width of transistor 604 is added to the pull up transistor of inverter 602 in determining transistor ratios, thus increasing the threshold at the input of the input buffer.

To control the threshold variation between a minimum provided by inverter 602 acting alone and a maximum where inverter 602 acts together with transistor 604, transistors 606 and 608 are provided. A resistance is provided through transistor 608 and a parasitic capacitance is provided at the gate of transistor 606 to form an RC delay. During a high to low transition of the input to the buffer, the capacitance at the gate of transistor 606 will discharge slowly, slowly turning off transistor 606. With transistor 606 slowly turning off, current from transistor 604 will be slowly diminished creating a varying threshold at the input of the buffer.

So that the varying threshold of the input buffer specifically compensates for an RC delay provided by a switch matrix, channel widths of transistors 606 and 608 are specifically controlled during manufacture. The channel widths of transistors 606 and 608 are set so that the parasitic capacitance at the gate of transistor 606 and the resistance provided by transistor 608 provide an RC delay which compensates for an RC delay of the switch matrix to which the input buffer is to be connected.

In operation of the circuit of FIG. 6, we begin by assuming IN is high. With IN high, PMOS transistor 604 will be off. Further, with IN high, the source of cascode transistor 608 will be above reference INREF turning off transistor 608. With INREF being $V_{DD}$ and transistor 608 being a depletion mode transistor, node n1 will be high, or at $V_{DD}$. With node n1 high transistor 606 will be on. Further with IN high, the output of inverter 602 will be low.

We next assume that the input IN transitions from high to low rapidly. With IN transitions from high to low rapidly, the pull up transistor of inverter 602 and the PMOS transistor 604 will start to turn on. Because of the parasitic capacitance provided at the gate of transistor 606, in combination with the resistance of transistor 608, n1 will stay high and will not drop right away. With the output of inverter 602 beginning to go high the capacitance between the source and the gate of transistor 606 will tend to push n1 up. Node n1 being pushed up will tend to keep transistor 606 on during the transition of IN. Transistor 606 will turn off very slowly. With transistor 604 acting together with the pull up transistor of inverter 602, the threshold at the input of the buffer will increase, for instance substantially above a 1.5 V median point.

We next assume that the input IN transitions from high to low more slowly. With a slow transition from high to low, the capacitance at node n1 will have time to discharge more in proportion to the transition of the IN signal. Thus, transistor 606 will be turned off more quickly, preventing transistor 608 from turning on together with the pull up transistor of inverter 602. With transistor 602 acting more alone, the threshold at the input of the buffer will not be as great, but remain near the 1.5 V median point suggested above.

With a transition of the signal IN from low to high, a similar transition of the threshold at the input of the buffer does not occur. When IN goes high at any rate, PMOS transistor 604 will turn off rapidly irrespective of any capacitance at the source of transistor 606 changing the operation speed of transistor 604.

For the buffer of the present invention to be TTL compatible, the nominal threshold of inverter 602 may be set to approximately 1.5 V. Because of the typical 0 V to 5 V difference between $V_{SS}$ and $V_{DD}$ for a CMOS buffer, such as inverter 602, the low to high IN voltage change before reaching the threshold of inverter 602 may be from 0 V to 1.5 V, while a high to low IN voltage change before reaching the threshold of inverter 602 will be from 5 V to 1.5 V. Because the high to low IN voltage range is greater before reaching a threshold of inverter 602, RC delay will affect the high to low transition more. To maintain a high operation speed, a variable threshold input buffer will, therefore, provide a more significant improvement on a high to low transition at IN. The present invention, therefore, provides a variable threshold only for a high to low IN signal change.

Figure 7:
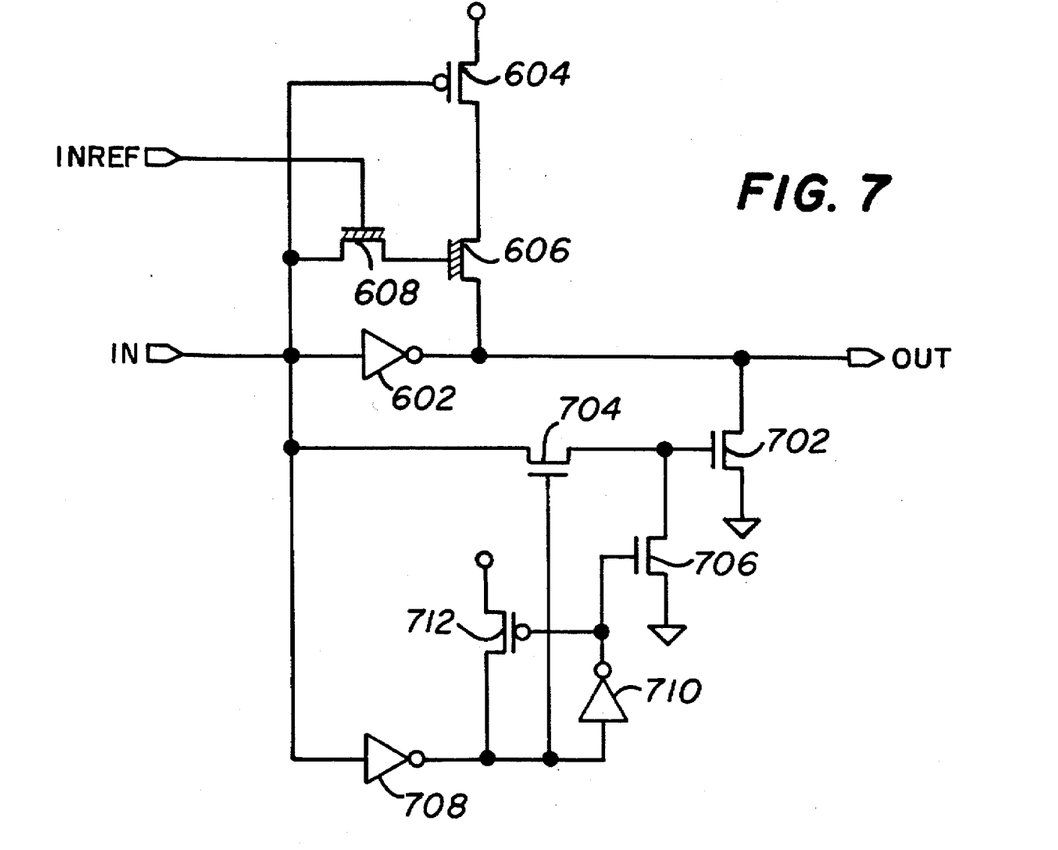
FIG. 7 shows addition of a negative hysteresis circuit to the circuitry of FIG. 6 to prevent instability and still speed up slow low to high input signal transitions.

Because the buffer only has a varying threshold on a high to low transition of an input signal, the buffer of the present invention further includes a negative hysteresis circuit to prevent oscillations on a slow rate low to high input signal transition. FIG. 7 shows modifications to the circuitry of FIG. 6 to provide such a negative hysteresis circuit.

The negative hysteresis circuit includes a pull down transistor 702 having a source to drain path connecting the output OUT of the input buffer to $V_{SS}$. A pass gate 704 has a source to drain path connecting the gate of transistor 702 to the input IN of the input buffer. Another pull down transistor 702 has a drain connected to the gate of transistor 702 and a source connected to $V_{SS}$. An inverter 708 connects the buffer input IN to the gate of transistor 704, while another inverter 710 connects the output of inverter 708 to the gate of transistor 706. To control the amount of hysteresis provided, a PMOS transistor 712 has a gate connected to the output of inverter 710 and a source to drain path connecting $V_{DD}$ to the input of inverter 710.

Figure 8:
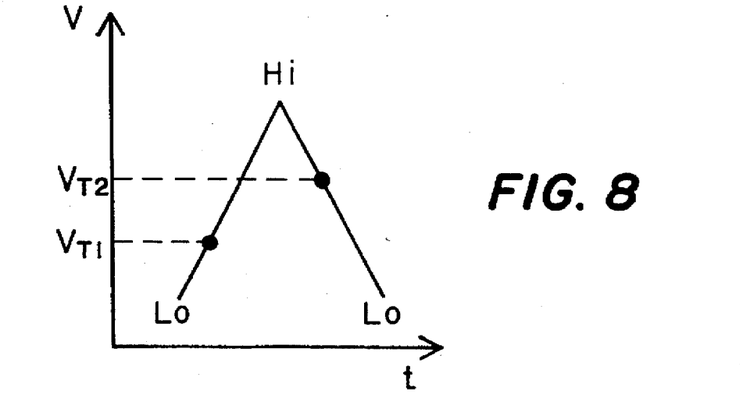
FIG. 8 plots voltage vs. time for a signal input to the buffer of FIG. 7 to illustrate how negative hysteresis is provided.

In operation, with transistor 702 operating in conjunction with the pull down transistor of inverter 602, the input buffer has a lower threshold than when inverter 602 acts alone. Note as discussed above, that the threshold of an inverter is determined by the ratio of the widths of its pull up transistor to pull down transistor, so with the width of transistor 702 added to the width of the pull down transistor of inverter 602, the nominal input threshold of the input buffer is decreased. The circuitry connecting the gate of transistor 702 to the buffer input IN enables the transistor 702 to act in conjunction with inverter 602 during low to high IN transitions, while enabling the inverter 602 to act alone during high to low transitions. FIG. 8 illustrates how negative hysteresis is provided by such circuitry by showing the nominal threshold $V_{T1}$ at the input of inverter 602 caused by transistor 702 and inverter 602 acting together on a low to high transition, and a higher nominal threshold $V_{T2}$ at the input of inverter 602 with inverter 602 acting alone on a high to low transition.

For a more detailed description of operation of the negative hysteresis circuit, we first assume that IN is high. With IN high, the output of inverter 708 will be low turning off transistor 704, removing the signal IN from the gate of transistor 702. Further, the output of inverter 710 will be high turning on transistor 706 to assure that the gate of transistor 702 is pulled to $V_{SS}$ keeping transistor 702 off.

Upon a transition of IN from high to low the pull down transistor of inverter 602 acts without transistor 702. Further, with IN going from high to low, the output of inverter goes high turning on pass transistor 704, and the output of inverter 710 goes low turning off transistor 706. Thus, a signal at the buffer input IN will be provided directly to transistor 702 to enable transistor 702 to act in conjunction with the pull down transistor 602 upon a transition of the input IN back to high.

With IN transitions from low back to high, transistor 702 turns on to pull down the output OUT in conjunction with the pull down transistor of inverter 602. Also, with IN going from low to high, the output of inverter 708 transitions from high to low to turn off transistor 704 and the output of inverter 710 transitions from low to high to turn on transistor 706 to enable turn off of transistor 702. The size of transistor 712 controls the speed at which inverters 708 and 710 transition to enable turn off of transistor 702 on a low to high IN transition. By adjusting the size of transistor 712, the amount of time transistor 702 acts in conjunction with the pull down transistor of inverter 602 can be controlled to control the difference between $V_{T1}$ and $V_{T2}$ as shown in FIG. 8 enabling control of hysteresis, particularly on a low speed transition of IN from low to high.

Figure 9:
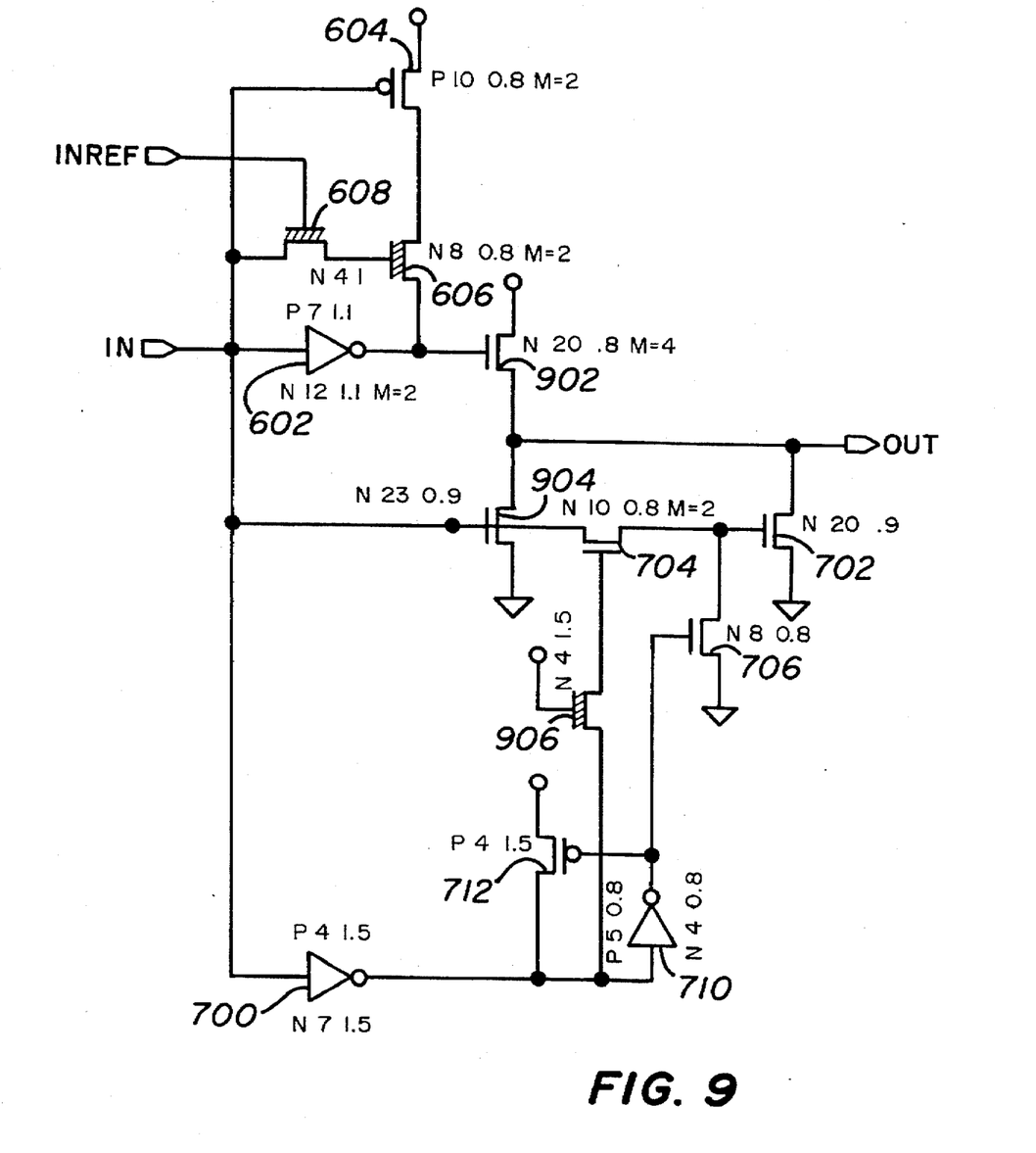
FIG. 9 shows modifications to the circuitry of FIG. 7 to increase switching speed and to enable driving a high capacitance load.

FIG. 9 shows modifications to the circuitry of FIG. 7 to increase switching speed and to enable driving a high capacitance load.

To enable driving a higher capacitance load, a noninverting buffer which includes transistors 902 and 904 is added. Transistor 902 has a gate connected to the output of inverter 602, and a source to drain path connecting $V_{DD}$ to the input buffer output OUT. Transistor 904 has a gate connected to the input buffer input IN and a source to drain path connecting OUT to $V_{SS}$. With the added noninverting input buffer, on low to high signal transitions of IN, transistor 702 will work in conjunction with transistor 904 to provide negative hysteresis rather than the pull down transistor of inverter 602. Otherwise, operation with the added noninverting buffer is similar to operation described with respect to FIG. 7.

To increase switching speed in the negative hysteresis circuit transistor 906 is used with a source to drain path connecting the gate of transistor 704 to the output of inverter 708. Transistor 906, as shown is a depletion type device with a gate connected to $V_{DD}$. Transistor 906 thus serves as a depletion mode transistor enabling the charge on the gate of transistor 704 to increase above $V_{DD}$ when the gate of transistor 704 is high and the input IN goes high. With increased charge on the gate of transistor 704, capacitance on its source to drain path is reduced making transistor 704 a "super pass gate". With gate capacitance on transistor 704 reduced, on a low to high transition of IN, transistor 704 will pass current to enable transistor 702 to turn on more rapidly.

For transistors shown in FIG. 9, a suggested channel type and transistor dimensions are indicated next to the transistor with a p or n indicating channel type followed by channel width and length in microns. An additional M=2 is included to indicate that two such transistors are included and connected identically. For inverters which include CMOS pull up and pull down transistors, channel type and dimensions are included above and below the inverter symbol. Transistor sizes and types are only suggested and may be changed to meet particular design requirements.

Other embodiments for a variable threshold input buffer are disclosed in U.S. patent application Ser. No. 08/341,636 entitled "Input Buffer For A High Density Programmable Logic Device" filed Nov. 17, 1994, and incorporated herein by reference.

Although the invention has been described above with particularity, this was merely to teach one of ordinary skill in the art how to make and use the invention. Many modifications will fall within the scope of the invention, as that scope is defined by the following claims.

What is claimed is:

1. A buffer comprising:
   an inverter having an input and an output;
   a pull up transistor having a gate connected to the input of the inverter and a source to drain path having a first end connected to $V_{DD}$ and a second end;
   a pull up switching transistor having a gate and a source to drain path having a first end connected to the second end of the source to drain path of the pull up transistor and a second end connected to the output of the inverter; and
   a pass transistor having a source to drain path with a first end connected to the input of the inverter and a second end connected to the gate of the pull up switching transistor.

2. The buffer of claim 1 wherein the pull up transistor is a PMOS transistor and the pull up switching transistor and pass transistor are depletion mode NMOS transistors.

3. The buffer of claim 1 wherein the buffer input is connected to a delay circuit having an RC delay, and wherein the size of the pass transistor is set so that the source to drain path of the pass transistor provides a given resistance, and the size of the pull up switching transistor is set so that the gate of the pull up switching transistor provides a the parasitic capacitance so that a combination of the given resistance and parasitic capacitance provides an RC delay matching the RC delay of the delay circuit.

4. The buffer of claim 1 wherein the inverter input forms an input of the buffer and the inverter output is coupled to an output of the buffer, the buffer further including a negative hysteresis circuit comprising:
   a pull down transistor having a source to drain path connecting the buffer output to $V_{SS}$, and a gate;
   a hysteresis switching circuit connected from the buffer input to the gate of the pull down transistor, the hysteresis switching circuit turning on the pull down transistor during a low to high transition of an input signal at the buffer input, and turning off the pull down transistor during a high to low transition of the input signal.

5. The buffer of claim 4 wherein the hysteresis switching circuit comprises:
   a switching pull down transistor having a source to drain path coupling the gate of the pull down transistor to $V_{SS}$ and a gate;
   a hysteresis pass gate coupling the buffer input to the gate of the pull down transistor, and a gate;
   a first hysteresis inverter having an input connected to the buffer input and an output; and
   a second hysteresis inverter having an input connected to the output of the first hysteresis inverter and the gate of the hysteresis pass gate, and an output connected to the gate of the switching pull down transistor.

6. The buffer of claim 5 wherein the hysteresis switching circuit further comprises:
   a hysteresis control transistor having a source to drain path coupling the input of the second hysteresis inverter to $V_{DD}$, and a gate connected to the output of the second hysteresis inverter.

7. The buffer of claim 5 wherein the hysteresis switching circuit further comprises:
   a depletion mode transistor having a source to drain path coupling the input of the second hysteresis inverter to the gate of the hysteresis pass gate and a gate coupled to $V_{DD}$.

8. The buffer of claim 4 further comprising:
   an first NMOS buffer transistor having a gate connected to the output of the inverter, and a source to drain path connecting $V_{DD}$ to the buffer output; and
   a second NMOS buffer transistor having a gate connected to the buffer input, and a source to drain path connecting the buffer output to $V_{SS}$.

9. A buffer having an input and an output, the buffer comprising:
   an inverter having an input forming the buffer input and an output coupled to the buffer output;
   a PMOS pull up transistor having a gate connected to the input of the inverter, a source connected to $V_{DD}$ and a drain, the PMOS pull up transistor being a depletion device;
   an NMOS pull up switching transistor having a gate, a drain connected to the drain of the PMOS pull up transistor and a source connected to the output of the inverter, the NMOS pull up switching transistor being a depletion device;
   an NMOS pass transistor having a source to drain path with a first end connected to the input of the inverter and a second end connected to the gate of the NMOS pull up switching transistor;

an NMOS pull down transistor having a drain connected to the buffer output, a source connected to $V_{SS}$, and a gate;

an NMOS pull down switching transistor having a drain connected to the gate of the NMOS pull down transistor, a source connected to $V_{SS}$ and a gate;

a hysteresis pass gate coupling the buffer input to the gate of the NMOS pull down transistor, and a gate;

a first hysteresis inverter having an input connected to the buffer input and an output; and a second hysteresis inverter having an input connected to the output of the first hysteresis inverter and the gate of the hysteresis pass gate, and an output connected to the gate of the NMOS switching pull down transistor.

10. The buffer of claim 9 further comprising:

a PMOS hysteresis control transistor having a source connected to $V_{DD}$, a drain connected to the input of the second hysteresis inverter and a gate connected to the output of the second hysteresis inverter.

11. The buffer of claim 10 further comprising:

a depletion mode transistor having a source to drain path coupling the input of the second hysteresis inverter to the gate of the hysteresis pass gate and a gate connected to $V_{DD}$.

12. The buffer of claim 11 further comprising:

an first NMOS buffer transistor having a gate connected to the output of the inverter, and a source to drain path connecting $V_{DD}$ to the buffer output; and a second NMOS buffer transistor having a gate connected to the buffer input, and a source to drain path connecting the buffer output to $V_{SS}$.

13. A buffer having an input and an output, the buffer comprising:

an inverter having an input connected to the buffer input and an output coupled to the buffer output;

a PMOS pull up transistor having a gate connected to the input of the inverter, a source connected to $V_{DD}$ and a drain, the PMOS pull up transistor being a depletion device;

an NMOS pull up switching transistor having a gate, a drain connected to the drain of the PMOS pull up transistor and a source connected to the output of the inverter, the NMOS pull up switching transistor being a depletion device;

an NMOS pass transistor having a source to drain path with a first end connected to the input of the inverter and a second end connected to the gate of the NMOS pull up switching transistors; and a negative hysteresis means, coupled between said input and output of said inverter, for decreasing a threshold at the buffer input when a voltage at the buffer input transitions from a low state to a high state.

14. The buffer of claim 13 wherein the negative hysteresis means comprises:

an NMOS pull down transistor having a drain connected to the buffer output, a source connected to $V_{SS}$, and a gate;

an NMOS switching pull down transistor having a drain connected to the gate of the NMOS pull down transistor, a source connected to $V_{SS}$ and a gate;

a hysteresis pass gate connecting the buffer input to the gate of the NMOS pull down transistor, and a gate;

a first hysteresis inverter having an input connected to the buffer input and an output; and a second hysteresis inverter having an input connected to the output of the first hysteresis inverter and the gate of the hysteresis pass gate, and an output connected to the gate of the NMOS switching pull down transistor.

* * * * *